(12) United States Patent
Park et al.

(10) Patent No.: US 9,136,147 B2
(45) Date of Patent: Sep. 15, 2015

(54) APPARATUS AND METHOD FOR TREATING SUBSTRATE

(75) Inventors: Joo Jib Park, Asan-si (KR); Oh Jin Kwon, Cheonan-si (KR); Sungho Jang, Cheonan-si (KR); Boong Kim, Cheonan-si (KR)

(73) Assignee: SEMES CO., LTD., Seobuk-Gu (KR)

( * ) Notice: Subject to any disclaimer, the term of this patent is extended or adjusted under 35 U.S.C. 154(b) by 522 days.

(21) Appl. No.: 13/559,838

(22) Filed: Jul. 27, 2012

(65) Prior Publication Data

US 2013/0029282 A1 Jan. 31, 2013

(30) Foreign Application Priority Data

Jul. 29, 2011 (KR) .......... 10-2011-0076240
Dec. 22, 2011 (KR) .......... 10-2011-0140008

(51) Int. Cl.
*F27D 1/18* (2006.01)
*H01L 21/67* (2006.01)
*F27B 17/00* (2006.01)

(52) U.S. Cl.
CPC ........ *H01L 21/6719* (2013.01); *F27B 17/0025* (2013.01); *H01L 21/67126* (2013.01); *H01L 21/67178* (2013.01)

(58) Field of Classification Search
CPC .......... H01L 21/67207; F27D 1/1858
USPC .......... 432/242, 250, 251; 110/173 R, 173 B, 110/176
See application file for complete search history.

(56) References Cited

U.S. PATENT DOCUMENTS

| 4,427,378 | A | * | 1/1984 | Bowers ......................... 432/242 |
| 4,692,115 | A | * | 9/1987 | Aldridge et al. .............. 432/242 |
| 5,217,369 | A | * | 6/1993 | Brown et al. .................. 432/250 |
| 5,632,820 | A | * | 5/1997 | Taniyama et al. ............. 118/724 |
| 6,302,684 | B1 | * | 10/2001 | Woo et al. ..................... 432/250 |
| 7,351,057 | B2 | * | 4/2008 | Berenbak et al. ............. 432/250 |

FOREIGN PATENT DOCUMENTS

| JP | 2001-110773 | 4/2001 |
| JP | 2003-051474 | 2/2003 |
| JP | 2003-282408 | 10/2003 |
| JP | 2010-182817 | 8/2010 |
| JP | 2012-519392 | 8/2012 |
| KR | 2004-0058207 A | 7/2004 |
| KR | 10-2007-0061942 | 6/2007 |
| KR | 10-0757847 | 9/2007 |
| WO | WO 2010/104231 | 9/2010 |

* cited by examiner

*Primary Examiner* — Gregory A Wilson
(74) *Attorney, Agent, or Firm* — Harness, Dickey & Pierce, PLC

(57) ABSTRACT

Provided are an apparatus and method for treating a substrate. More particularly, an apparatus and method for treating a substrate through a supercritical process are provided. The apparatus includes: a housing having an entrance in a predetermined surface thereof and providing a space for performing a high pressure process; a support member disposed in the housing to support a substrate; a door for opening and closing the entrance; and a pressing member configured to apply a force to the door so as to close the housing during the high pressure process.

18 Claims, 14 Drawing Sheets

APPARATUS AND METHOD FOR TREATING SUBSTRATE

CROSS-REFERENCE TO RELATED APPLICATIONS

This U.S. non-provisional patent application claims priority under 35 U.S.C. §119 of Korean Patent Application Nos. 10-2011-0076240, filed on Jul. 29, 2011, and 10-2011-0140008, filed on Dec. 22, 2011, the entire contents of which are hereby incorporated by reference.

BACKGROUND OF THE INVENTION

The present invention disclosed herein relates to an apparatus and method for treating a substrate, and more particularly, to an apparatus and method for treating a substrate through a supercritical process.

Semiconductor devices are manufactured by forming circuit patterns on a substrate through various processes such as a photolithography process. During such processes, contaminants such as particles, organic contaminants, and metallic impurities are generated, which cause defects on a substrate and affect the yield of semiconductor device manufacturing processes. Therefore, cleaning processes are included in semiconductor device manufacturing processes to remove such contaminants.

Generally, a cleaning process is performed by removing contaminants from a substrate using a detergent, washing the substrate using deionized water (DI water), replacing the DI water with an organic solvent having low surface tension such as isopropyl alcohol (IPA), and evaporating the organic solvent. However, semiconductor devices having fine circuit patterns are not satisfactorily dried, and the fine circuit patterns may easily collapse even by low surface tension of an organic solvent during a drying process.

Thus, as a drying process, the use of a supercritical drying process increases, in which a supercritical fluid is used to dry semiconductor devices having a line width of about 30 nm or lower. Supercritical fluids mean any substance being at a temperature and pressure above its critical point and having both the gas and liquid properties. Supercritical fluids are outstanding in diffusion ability, permeation ability, and dissolving other substrates, and have little surface tension. Thus, supercritical fluids can be usefully used for dying substrates.

However, a process chamber for performing a supercritical process has a large foot print to maintain a high-pressure supercritical state, and thus the substrate throughput thereof is low.

SUMMARY OF THE INVENTION

The present invention provides an apparatus and method for treating a substrate through a supercritical process using a process chamber having high spatial efficiency.

The present invention also provides an apparatus and method for treating a substrate in a high pressure condition.

The present invention is not limited thereto. Other features and spirit of the present invention will be apparently understood by those skilled in the art through the following description and accompanying drawings.

Embodiments of the present invention provide apparatuses for treating a substrate.

The apparatuses include: a housing including an entrance in a predetermined surface thereof and providing a space for performing a high pressure process; a support member disposed in the housing to support a substrate; a door for opening and closing the entrance; and a pressing member configured to apply a force to the door so as to close the housing during the high pressure process.

In some embodiments, the apparatuses may further include: a door actuator configured to move the door; and a link having an end coupled to the housing and the other end coupled to the door for guiding movement of the door.

In other embodiments, the end of the link may be coupled to a side surface of the housing perpendicular to the predetermined surface of the housing in which the entrance is formed, and the other end of the link may be coupled to a side surface of the door perpendicular to an entrance-closing surface of the door used to close the entrance.

In still other embodiments, the link may guide the door in such a manner that the door is rotated on the end of the link.

In even other embodiments, the apparatuses may further include another link, wherein the links may be coupled to both sides of the housing and the door, respectively.

In yet other embodiments, the predetermined surface of the housing and the entrance-closing surface of the door may be formed in corresponding curved shapes.

In further embodiments, the link may guide the door in such a manner that the door is moved upward or downward while a surface of the door making contact with the predetermined surface of the housing is kept in parallel with the predetermined surface of the housing.

In still further embodiments, the apparatuses may further include another link, wherein the links may be coupled to both sides of the housing and the door, respectively.

In even further embodiments, the pressing member may include: a pressing plate configured to press the door at an opposite surface to the entrance-closing surface of the door; a cylinder configured to generate a driving force; and a rod having an end to which the pressing plate is coupled, the rod being configured to transmit the driving force of the cylinder to the pressing plate.

In yet further embodiment, a groove may be formed in a top surface or a bottom surface of the door, and if the door is lifted, the rod may be inserted in the groove and the pressing plate may be placed on the opposite surface of the door.

In some embodiments, the apparatuses may further include: a heating member configured to heat an inside of the housing; a supply port configured to supply a supercritical fluid to the housing; and an exhaust port configured to discharge the supercritical fluid from the housing.

In other embodiments, the supply port may include: an upper supply port disposed at an upper surface of the housing; and a lower supply port disposed at a lower surface of the housing.

In other embodiments of the present invention, there are provided apparatuses for treating a substrate, the apparatuses including: a transfer chamber configured to transfer a substrate; and a process chamber including a housing that has an entrance in a predetermined surface thereof and provides a space for performing a high pressure process, a support member disposed in the housing to support the substrate, a door for opening and closing the entrance, and a pressing member configured to apply a force to the door to close the housing during the high pressure process, wherein a side surface of the transfer chamber faces the predetermined surface of the housing.

In some embodiments, the process chamber may further include: a door actuator configured to move the door; and a link having an end coupled to the housing and the other end coupled to the door for guiding movement of the door.

In other embodiments, the link may guide the door in such a manner that the door is rotated on the end of the link.

In still other embodiments, the end of the link may be coupled to a side surface of the housing perpendicular to the predetermined surface of the housing in which the entrance is formed, and the other end of the link may be coupled to a side surface of the door perpendicular to an entrance-closing surface of the door used to close the entrance, wherein the process chamber may further include another link, and the links may be provided at both sides of the housing and the door, respectively, wherein the predetermined surface of the housing and the entrance-closing surface of the door may be formed in corresponding curved shapes.

In even other embodiments, the link may guide the door in such a manner that the door is moved upward or downward while a surface of the door making contact with the predetermined surface of the housing is kept in parallel with the predetermined surface of the housing.

In yet other embodiments, the end of the link may be coupled to a side surface of the housing perpendicular to the predetermined surface of the housing in which the entrance is formed, and the other end of the link may be coupled to a side surface of the door perpendicular to an entrance-closing surface of the door used to close the entrance, wherein the process chamber may further include another link, and the links may be provided at both sides of the housing and the door, respectively.

In further embodiments, the pressing member may include: a pressing plate configured to press the door at a surface opposite to the entrance-closing surface of the door; a cylinder configured to generate a driving force; and a rod having an end to which the pressing plate is coupled, the rod being configured to transmit the driving force of the cylinder to the pressing plate.

In still further embodiments, a groove may be formed in a top surface or a bottom surface of the door, and if the door is lifted, the rod may be inserted in the groove and the pressing plate may be placed on the opposite surface of the door.

In even further embodiments, the apparatuses may include a plurality of process chambers, and the plurality of process chambers may be vertically stacked.

In still other embodiments of the present invention, there are provided methods for treating a substrate.

The methods include: carrying a substrate into a housing through an entrance; closing the entrance with a door; pressing the door at a surface opposite to an entrance-closing surface of the door so as to close the housing; and performing a predetermined process on the substrate disposed in the closed housing.

In some embodiments, the closing of the entrance may be performed by vertically moving the door relative to the entrance.

BRIEF DESCRIPTION OF THE DRAWINGS

The accompanying drawings are included to provide a further understanding of the present invention, and are incorporated in and constitute a part of this specification. The drawings illustrate exemplary embodiments of the present invention and, together with the description, serve to explain principles of the present invention. In the drawings.

DETAILED DESCRIPTION OF PREFERRED EMBODIMENTS

In the following description, terms and drawings are used for explaining embodiments of the present invention while not limiting the present invention.

Known techniques used in the present invention but not related to the concept of the present invention will not be explained in detail.

Hereinafter, a substrate treating apparatus 100 will be described according to exemplary embodiments of the present invention.

The substrate treating apparatus 100 may be used to perform a supercritical process for treating a substrate (S) using a supercritical fluid as a process fluid.

The term "substrate (S)" is used herein to denote any substrate used to manufacture a product such as a semiconductor device and a flat panel display (FPD) in which circuit patterns are formed on a thin film. Examples of substrates (S) include wafers such as silicon wafers, glass substrates, and organic substrates.

The term "supercritical fluid" means any substance having both the gas and liquid characteristics because the phase of the substance is in a supercritical state above its critical temperature and pressure. A supercritical fluid has molecular density close to that of liquid and viscosity close to that of gas, and is thus outstanding in diffusion ability, permeation ability, and dissolving other substances. Therefore, a supercritical fluid is advantageous in chemical reaction. In addition, a supercritical fluid has little surface tension, and thus applies little interfacial tension to microstructures.

Supercritical processes are performed using the properties of a supercritical fluid, and examples of supercritical processes include a supercritical drying process and a supercritical etch process. Hereinafter, a supercritical process will be explained based on a supercritical drying process. Although the following explanation is given based on a supercritical drying process for conciseness of the explanation, the substrate treating apparatus 100 can be used for performing other supercritical processes.

A supercritical drying process may be performed to dissolve an organic solvent remaining on circuit patterns of a substrate (S) in a supercritical fluid and dry the substrate (S). In this case, satisfactory dry efficient may be obtained while preventing pattern collapse. A substance miscible with an organic solvent may be used as a supercritical fluid in a supercritical drying process. For example, supercritical carbon dioxide ($scCO_2$) may be used as a supercritical fluid.

Figure 1:
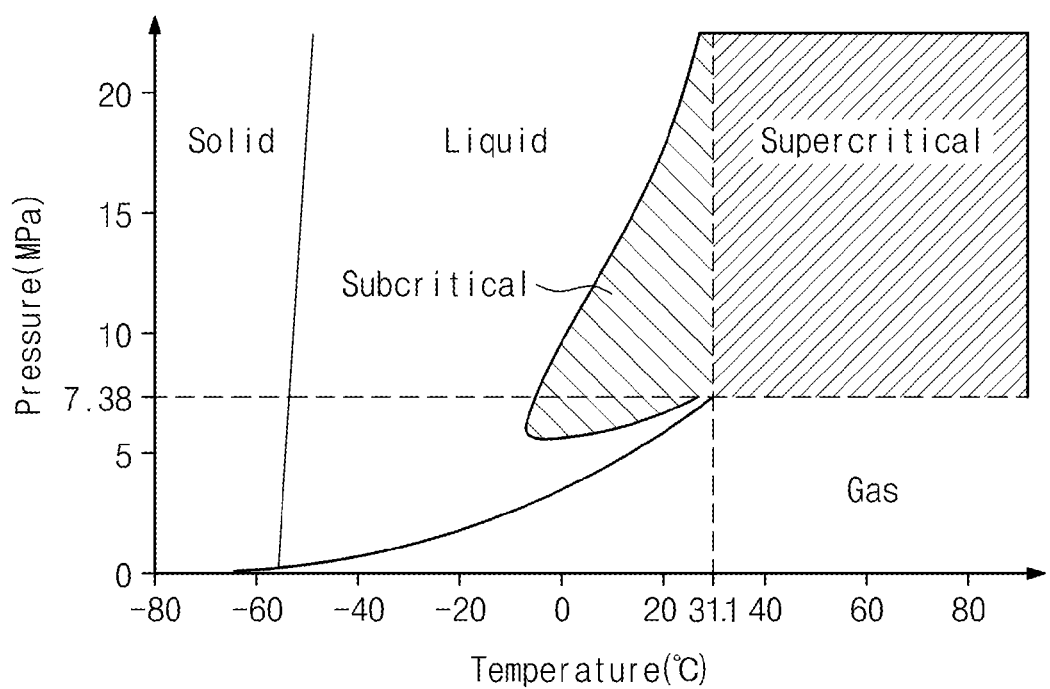
FIG. 1 is a phase diagram of carbon dioxide.

FIG. 1 is a phase diagram of carbon dioxide.

Since carbon dioxide has a relatively low critical temperature of 31.1° C. and critical pressure of 7.38 Mpa, it is easy to make carbon dioxide supercritical and control the phase of carbon dioxide by adjusting temperature and pressure. In addition carbon dioxide is inexpensive. In addition, carbon dioxide is nontoxic, harmless, nonflammable, and inert, and has a diffusion coefficient about ten to hundred times the diffusion coefficient of water or other organic solvents to rapidly permeate and replace an organic solvent. Furthermore, carbon dioxide has little surface tension. That is, the properties of carbon dioxide are suitable for drying a substrate (S) having fine patterns. In addition, carbon dioxide obtained from byproducts of various chemical reactions can be reused, and carbon dioxide used in a supercritical drying process can be separated from an organic solvent by vaporizing the carbon dioxide for reusing the carbon dioxide. That is, carbon dioxide is environmentally friendly.

Hereinafter, the substrate treating apparatus 100 will be described according to an embodiment of the present invention. The substrate treating apparatus 100 of the embodiment may be used to perform a cleaning process including a supercritical drying process.

Figure 2:
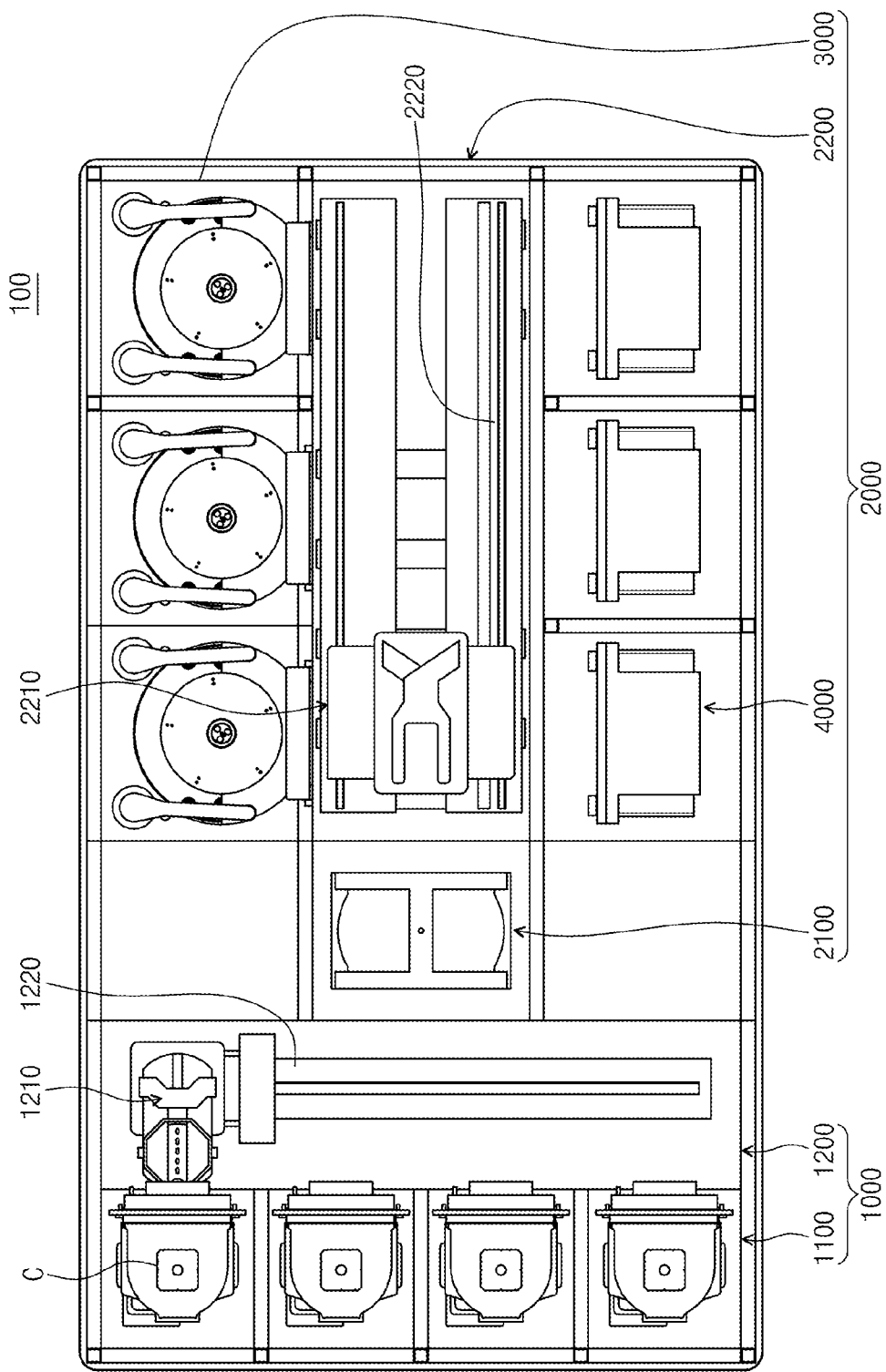
FIG. 2 is a plan view illustrating a substrate treating apparatus according to an embodiment of the present invention.
Figure 3:
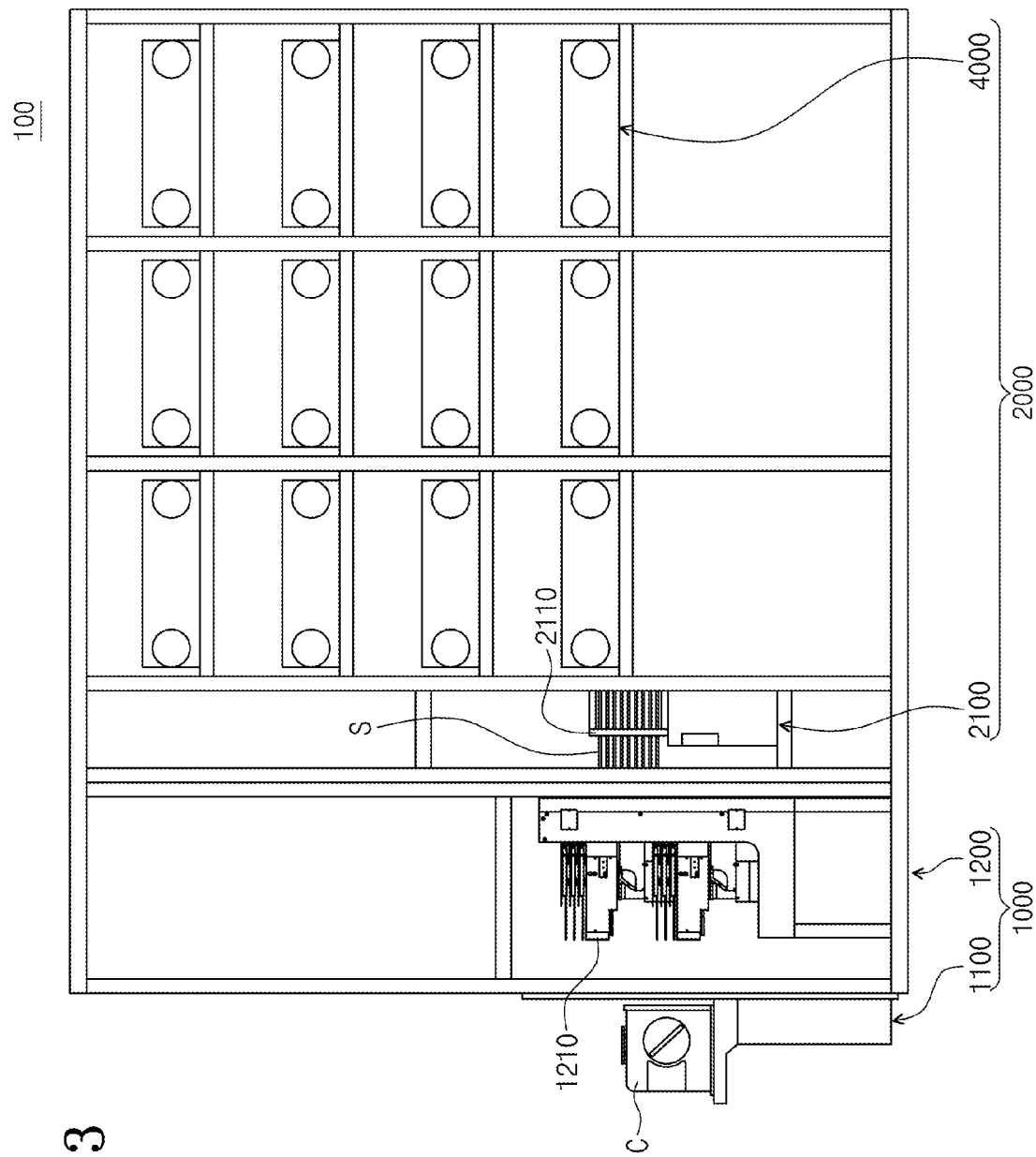
FIG. 3 is a sectional view illustrating the substrate treating apparatus according to an embodiment of the present invention.

FIG. 2 is a plan view illustrating the substrate treating apparatus 100 according to an embodiment of the present invention, and FIG. 3 is a sectional view illustrating the substrate treating apparatus 100 according to an embodiment of the present invention.

Referring to FIGS. 2 and 3, the substrate treating apparatus 100 includes an index module 1000 and a process module 2000.

The index module 1000 may receive substrates (S) from an external apparatus and carry the substrates (S) to the process module 2000, and the process module 2000 may perform a supercritical drying process.

The index module 1000 is an equipment front end module (EFEM) and includes load ports 1100 and a transfer frame 1200.

Containers (C) in which substrates (S) are stored are placed on the load ports 1100. Front opening unified pods (FOUPs) may be used as containers (C). Containers (C) may be carried to the load ports 1100 from an outside area or carried from the load ports 1100 to an outside area via an overhead transfer (OHT).

The transfer frame 1200 carries substrates (S) between the containers (C) placed on the load ports 1100 and the process module 2000. The transfer frame 1200 includes an index robot 1210 and an index rail 1220. The index robot 1210 may carry a substrate (S) while moving on the index rail 1220.

The process module 2000 is a module in which processes are actually performed. The process module 2000 includes a buffer chamber 2100, a transfer chamber 2200, a first process chamber 3000, and a second process chamber 4000.

A substrate (S) is temporarily stored in the buffer chamber 2100 while being carried between the index module 1000 and the process module 2000. A buffer slot may be formed in the buffer chamber 2100 to place a substrate (S) therein. For example, the index robot 1210 may pick up a substrate (S) from a container (C) and place the substrate (S) in the buffer slot, and a transfer robot 2210 of the transfer chamber 2200 may pick up the substrate (S) from the buffer slot and transfer the substrate (S) to the first process chamber 3000 or the second process chamber 4000. A plurality of buffer slots may be formed in the buffer chamber 2100 so that a plurality of substrates (S) can be placed in the buffer chamber 2100.

A substrate (S) is carried among the buffer chamber 2100, the first process chamber 3000, and the second process chamber 4000 through the transfer chamber 2200. The transfer chamber 2200 may include the transfer robot 2210 and a transfer rail 2220. The transfer robot 2210 may carry a substrate (S) while moving on the transfer rail 2220.

The first process chamber 3000 and the second process chamber 4000 may be used to perform a cleaning process. Procedures of a cleaning process may be sequentially performed in the first process chamber 3000 and the second process chamber 4000. For example, a chemical process, a rinsing process, and an organic solvent process of a cleaning process may be performed in the first process chamber 3000, and a supercritical drying process of the cleaning process may be performed in the second process chamber 4000.

The first process chamber 3000 and the second process chamber 4000 are disposed on sides of the transfer chamber 2200. For example, the first process chamber 3000 and the second process chamber 4000 may disposed on opposite sides of the transfer chamber 2200 to face each other.

The process module 2000 may include a plurality of first process chambers 3000 and a plurality of second process chambers 4000. In this case, the first process chambers 3000 and the second process chambers 4000 may be arranged in lines along sides of the transfer chamber 2200 or may be vertically stacked at sides of the transfer chamber 2200. In addition, the first process chambers 3000 and the second process chambers 4000 may be arranged in a combination of the above-mentioned manners.

Arrangement of the first process chambers 3000 and the second process chambers 4000 is not limited to the above-mentioned manner. That is, the first process chambers 3000 and the second process chambers 4000 may be arranged in various manners in consideration of the footprint or processing efficiency of the substrate treating apparatus 100.

Hereinafter, the first process chamber 3000 will be described in detail.

Figure 4:
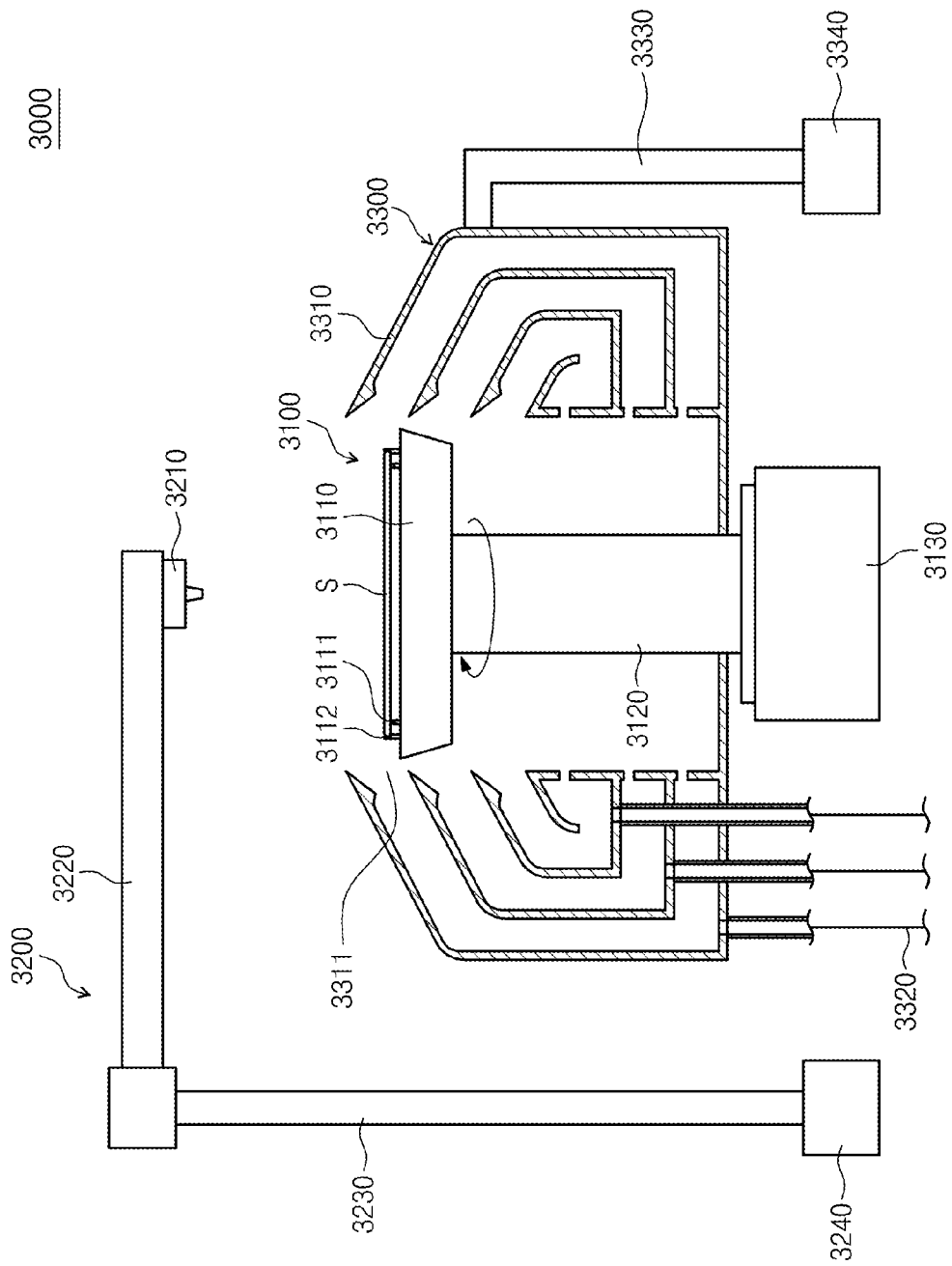
FIG. 4 is a sectional view illustrating a first process chamber depicted in FIG. 2, according to an embodiment of the present invention.

FIG. 4 is a sectional view illustrating the first process chamber 3000 depicted in FIG. 2.

The first process chamber 3000 may be used to perform a chemical process, a rinsing process, and an organic solvent process. Alternatively, the first process chamber 3000 may be used to perform some of such processes. The chemical process may be performed to remove contaminants from a substrate (S) by applying a detergent to the substrate (S), the rinsing process may be performed to remove the detergent remaining on the substrate (S) by applying a rinsing agent to the substrate (S), and the organic solvent process may be performed to replace a rinsing agent remaining between circuit patterns of the substrate (S) with an organic solvent having low surface tension.

Referring to FIG. 4, the first process chamber 3000 includes a support member 3100, a nozzle member 3200, and a collecting member 3300.

The support member 3100 may support a substrate (S) and rotate the substrate (S). The support member 3100 may include a support plate 3110, support pins 3111, chucking pins 3112, a rotation shaft 3120, and a rotary actuator 3130.

The support plate 3110 has a top surface shaped like a substrate (S), and the support pins 3111 and the chucking pins 3112 are provided on the top surface of the support plate 3110. The support pins 3111 may support a substrate (S), and the chucking pins 3112 may hold the substrate (S) firmly.

The rotation shaft 3120 is connected to the bottom side of the support plate 3110. The rotation shaft 3120 receives rotation power from the rotary actuator 3130 and rotates the support plate 3110. Thus, a substrate (S) placed on the support plate 3110 can be rotated. At this time, the chucking pins 3112 prevent the substrate (S) from departing from a set position.

The nozzle member 3200 injects a chemical to the substrate (S). The nozzle member 3200 includes a nozzle 3210, a nozzle bar 3220, a nozzle shaft 3230, and a nozzle shaft actuator 3240.

The nozzle 3210 is used to inject a chemical to the substrate (S) placed on the support plate 3110. The chemical may be a detergent, a rinsing agent, or an organic solvent. Examples of the detergent may include: a hydrogen peroxide ($H_2O_2$) solution; a solution prepared by mixing a hydrogen peroxide solution with ammonia ($NH_4OH$), hydrochloric acid (HCl), or sulfuric acid ($H_2SO_4$); and a hydrofluoric acid (HC) solution. The rinsing agent may be pure water. Examples of the organic solvent may include: isopropyl alcohol, ethyl glycol, 1-propanol, tetrahydrofuran, 4-hydroxy-4-methyl-2-pentanone, 1-butanol, 2-butanol, methanol, ethanol, n-propyl alcohol, and dimethyl ether. Such organic solvents may be used in the form of a solution or gas.

The nozzle 3210 is provided on a lower side of an end of the nozzle bar 3220. The nozzle bar 3220 is coupled to the nozzle shaft 3230, and the nozzle shaft 3230 can be lifted or rotated. The nozzle shaft actuator 3240 may lift or rotate the nozzle shaft 3230 to adjust the position of the nozzle 3210.

The collecting member 3300 collects a supplied chemical. If a chemical is supplied to the substrate (S) through the nozzle member 3200, the support member 3100 may rotate the substrate (S) so as to distribute the chemical uniformly to the entire area of the substrate (S). When the substrate (S) is rotated, the chemical may scatter from the substrate (S). The collecting member 3300 collects the chemical scattering from the substrate (S).

The collecting member 3300 may include a collecting vessel 3310, a collecting line 3320, a lift bar 3330, and a lift actuator 3340.

The collecting vessel 3310 has a ring shape surrounding the support plate 3110. A plurality of collecting vessels 3310 may be provided. In this case, the collecting vessels 3310 may have ring shapes sequentially spaced apart from the support plate 3110 when viewed from the topside. The more distant the collecting vessel 3310 is from the support plate 3110, the higher the collecting vessel 3310 is. Collecting slots 3311 are formed between the collecting vessels 3310 to receive a chemical scattering from the substrate (S).

The collecting line 3320 is formed on the bottom side of the collecting vessel 3310. A chemical collected in the collecting vessel 3310 is supplied to a chemical recycling system (not shown) through the collecting line 3320.

The lift bar 3330 is connected to the collecting vessel 3310 to receive power from the lift actuator 3340 and move the collecting vessel 3310 vertically. If a plurality of collecting vessels 3310 are provided, the lift bar 3330 may be connected to the outermost collecting vessel 3310. The lift actuator 3340 may lift or lower the collecting vessels 3310 using the lift bar 3330 so as to adjust the position of one of the collecting slots 3311 when a scattering chemical is collected through the one of the collecting slots 3311.

Hereinafter, the second process chamber 4000 will be described in detail.

The second process chamber 4000 may be used to perform a supercritical drying process using a supercritical fluid. As described above, the second process chamber 4000 may be used to perform other processes as well as a supercritical drying process. In addition, the second process chamber 4000 may be used to perform a process using a process fluid other than a supercritical fluid.

The second process chamber 4000 may be disposed at a side of the transfer chamber 2200. A plurality of second process chambers 4000 may be provided. In this case, the second process chambers 4000 may be arranged in a line along a side of the transfer chamber 2200 or may be vertically stacked at a side of the transfer chamber 2200. In addition, the second process chambers 4000 may be arranged in a combination of the above-mentioned manners. In the substrate treating apparatus 100, the load ports 1100, the transfer frame 1200, the buffer chamber 2100, and the transfer chamber 2200 may be sequentially arranged in a direction, and the second process chambers 4000 may be arranged at a side of the transfer chamber 2200 in the direction.

Hereinafter, the second process chamber 4000 will be described according to an embodiment of the present invention.

Figure 5:
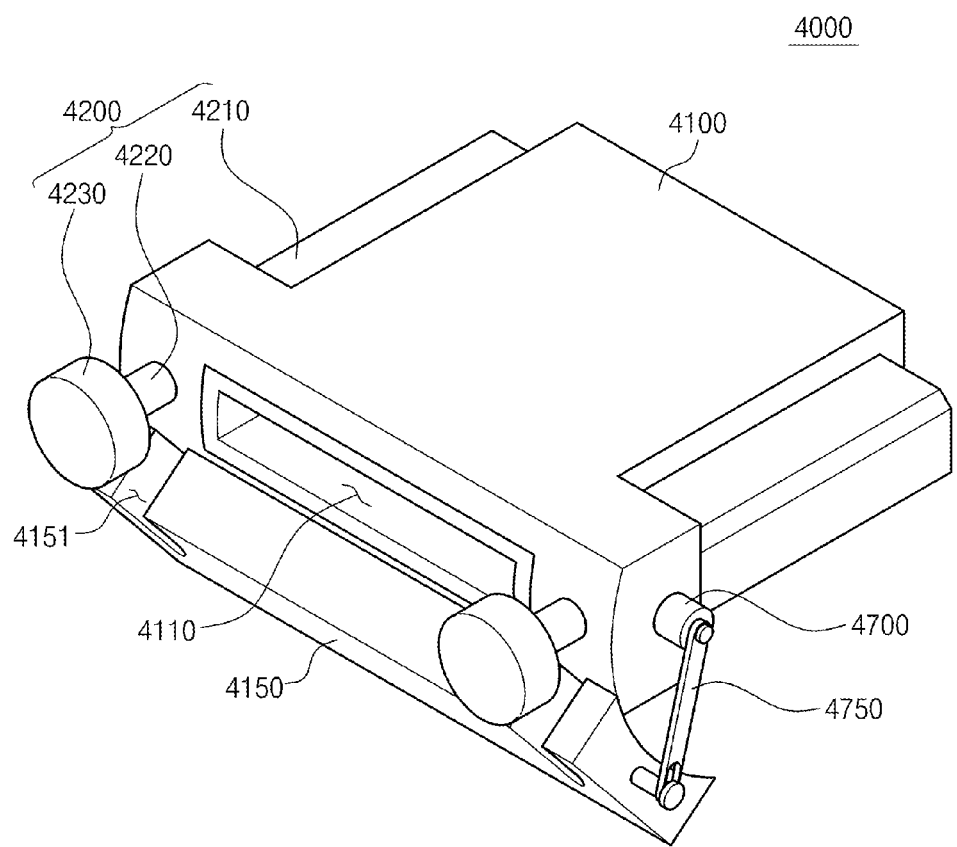
FIGS. 5 and 6 are perspective views illustrating a second process chamber depicted in FIG. 2, according to an embodiment of the present invention.
Figure 6:
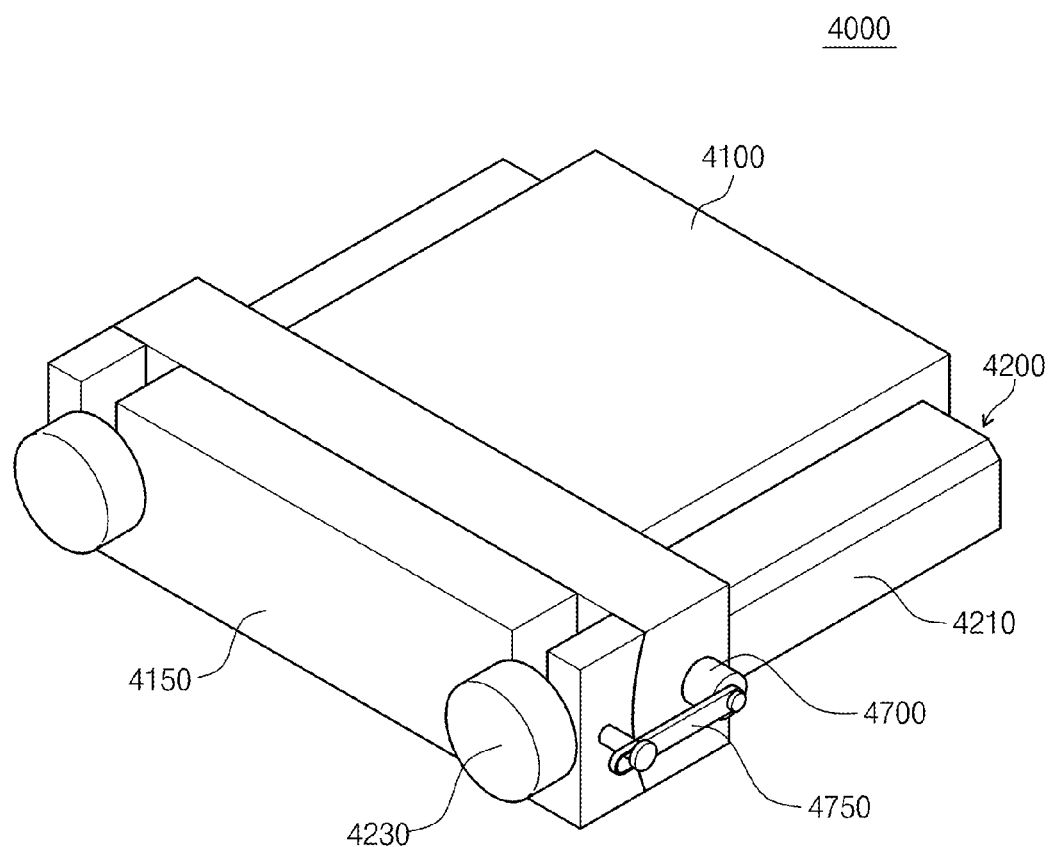
Figure 7:
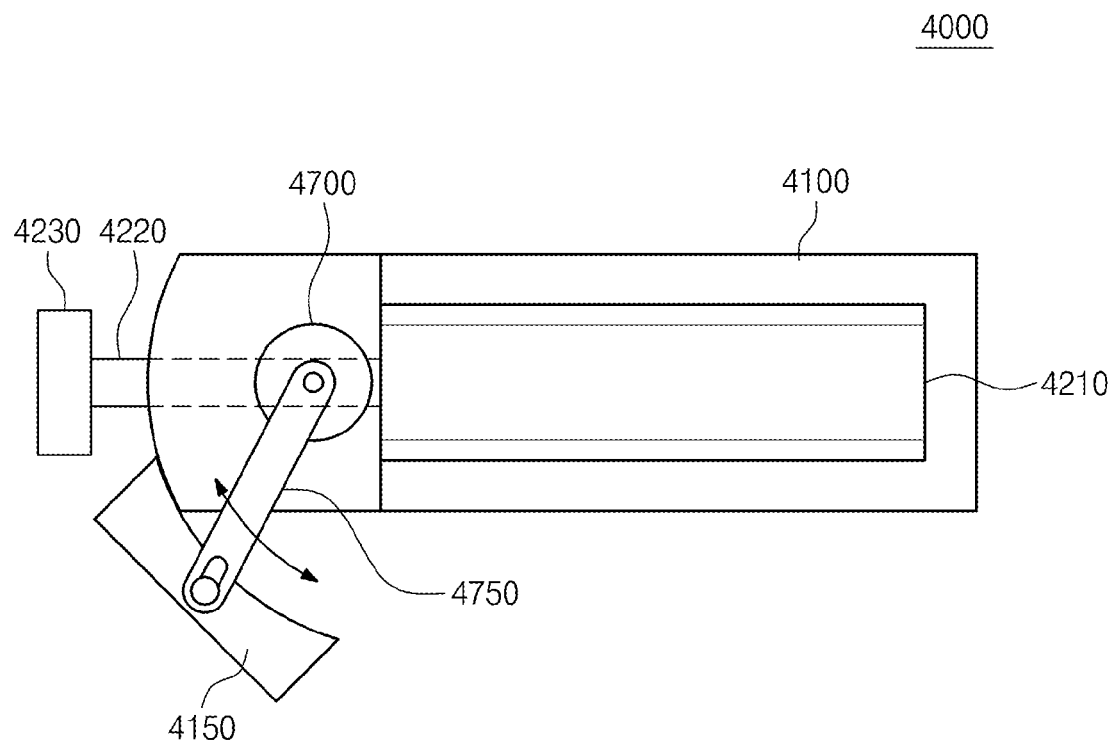
FIGS. 7 through 9 are sectional views illustrating the second process chamber depicted in FIG. 2, according to the embodiment of the present invention.
Figure 8:
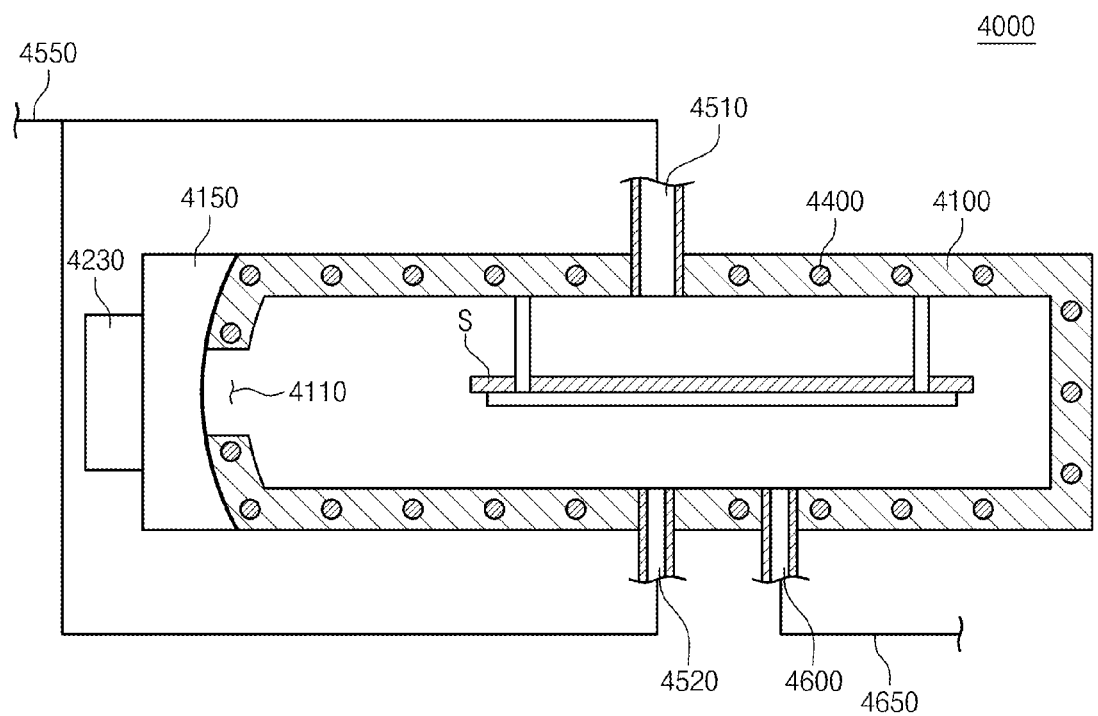
Figure 9:
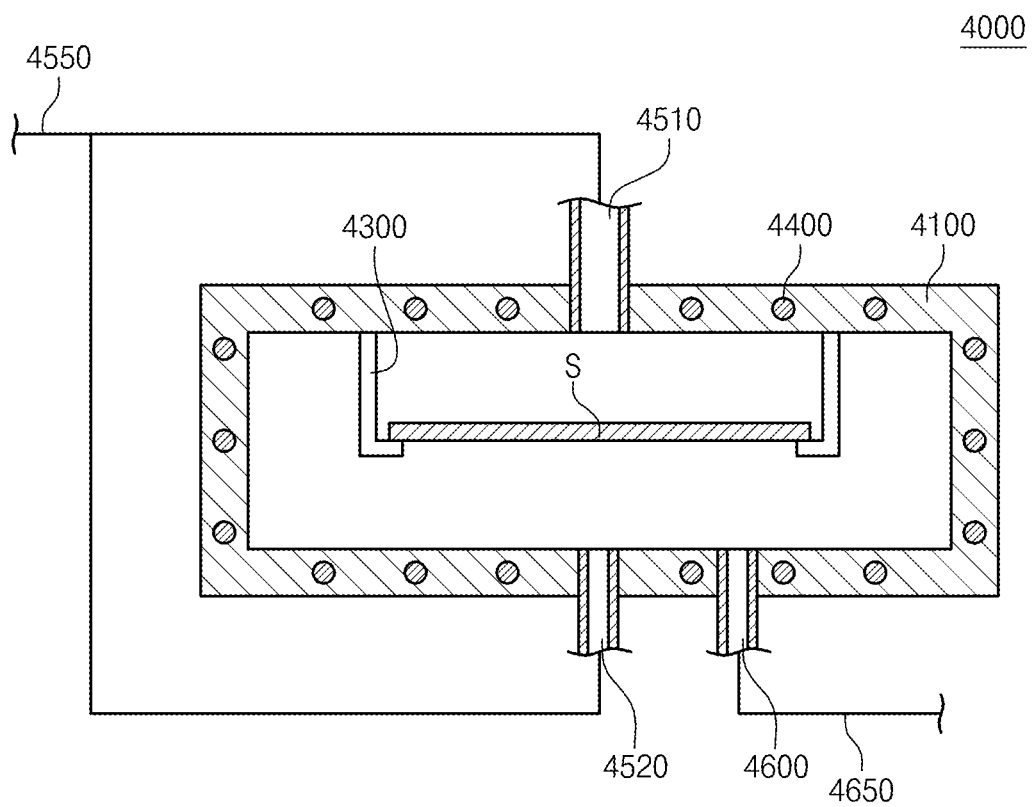

FIGS. 5 and 6 are perspective views illustrating the second process chamber 4000 depicted in FIG. 2, according to an embodiment of the present invention, and FIGS. 7 through 9 are sectional views illustrating the second process chamber 4000 depicted in FIG. 2, according to the embodiment of the present invention.

Referring to FIGS. 5 through 9, the second process chamber 4000 may include a housing 4100, a door 4150, a door actuator 4700, a door link 4750, pressing members 4200, a support member 4300, a heating member 4400, supply ports 4500, and an exhaust port 4600.

The housing 4100 provides a space in which a supercritical drying process can be performed. The housing 4100 is formed of a material resistant to high pressures equal to or higher than a critical pressure.

An entrance 4110 is formed in a side of the housing 4100. A substrate (S) may be carried into or out of the housing 4100 through the entrance 4110. A substrate (S) on which an organic solvent remains after an organic solvent process performed in the first process chamber 3000 may be carried into the housing 4100.

A surface of the housing 4100 in which the entrance 4110 is formed may face a side of the transfer chamber 2200 on which the second process chamber 4000 is disposed. In this structure, the transfer robot 2210 of the transfer chamber 2200 may move into the housing 4100 through the entrance 4110 to carry a substrate (S) into the housing 4100.

The door 4150 may be used to close or open the entrance 4110. The door 4150 may be moved downward to open the entrance 4110 and upward to close the entrance 4110. Alternatively, the door 4150 may be moved downward to close the entrance 4110 and upward to open the entrance 4110. Alternatively, the door 4150 may be horizontally moved to open or close the housing 4100. That is, the door 4150 may be moved relative to the surface of the housing 4100 in which the entrance 4110 is formed, so that the door 4150 can be placed away from the surface of the housing 4100 to open the housing 4100 or against the surface of the housing 4100 to close the housing 4100.

The door link 4750 guides such movement of the door 4150. An end of the door link 4750 may be coupled to a side of the surface of the housing 4100 in which the entrance 4110 is formed, and the other end of the door link 4750 may be coupled to a side of an entrance-closing surface of the door 4150. That is, the other end of the door link 4750 may be coupled to a side of a surface of the door 4150 facing the entrance 4110. Owing to the door link 4750, the door 4150 can be moved upward or downward with respect to the entrance 4110 while being rotated about the end of the door link 4750 coupled to the housing 4100.

The door actuator 4700 moves the door 4150. The door actuator 4700 may be disposed at the end of the door link 4750 coupled to the housing 4100 so as to rotate the door link 4750. As the door link 4750 is rotated by the door actuator 4700, the door 4150 can be moved upward or downward. Instead of being coupled to the door link 4750, the door actuator 4700 may be coupled to the door 4150 to apply a force directly to the door 4150.

The mutually-facing surfaces of the housing 4100 and the door 4150 may have corresponding shapes. For example, the surface of the housing 4100 in which the housing 4100 is formed may have a convex curvature, and the corresponding surface of the door 4150 may have a concave curvature. Then, the door 4150 may be rotated while making contact with the housing 4100.

The pressing members 4200 may push a surface of the door 4150 opposite to the housing 4100. That is, the pressing members 4200 may push a surface of the door 4150 opposite to the entrance-closing surface of the door 4150. In this way, the pressing members 4200 can bring the door 4150 into tight contact with the entrance 4110 to close the housing 4100 securely. Particularly, during a supercritical drying process, the pressing members 4200 may apply forces to the door 4150 against the entrance 4110 so as to keep the housing 4100 in a closed state. Since a supercritical drying process is performed at a high pressure in a supercritical state, a force is applied to the door 4150 in a direction away from the entrance 4110 due to a pressure difference between the inside and outside of the housing 4100 during the supercritical drying process. However, the pressing members 4200 apply a force greater than the force to the door 4150 in the opposite direction so that the housing 4100 can be kept in a closed state during the supercritical drying process.

The pressing members 4200 may include pressing cylinders 4210 and pressing rods 4220, and pressing plates 4230. The pressing cylinders 4210 generate driving forces. The pressing rods 4220 may be connected to the pressing cylinders 4210 to receive forces from the pressing cylinders 4210 and transfer the forces to the pressing plates 4230. The pressing plates 4230 may be disposed on ends of the pressing rods 4220 to apply forces to the door 4150.

For example, the pressing cylinders 4210 may be disposed at both sides of the housing 4100; the pressing rods 4220 may be inserted in the housing 4100; and the pressing plates 4230 may be in contact with a surface of the door 4150 opposite to the entrance 4110 so as to apply forces to the door 4150 in a direction toward the housing 4100.

Grooves 4151 may be formed in the topside of the door 4150 to receive the pressing rods 4220 inserted in the housing 4100. The grooves 4151 have a shape so that the pressing rods 4220 can be inserted in the grooves 4151 but the pressing plates 4230 cannot pass through the grooves 4151. As the door 4150 is moved upward, the pressing rods 4220 are inserted in the grooves 4151. Thus, the door 4150 can be moved to close the entrance 4110 without interference with the pressing members 4200. When the pressing rods 4220 are inserted in the grooves 4151 of the door 4150, the pressing plates 4230 is located at a surface of the door 4150 opposite to the housing 4100. Thus, when the door 4150 closes the housing 4100, the pressing members 4200 can apply forces to the door 4150.

The support member 4300 supports a substrate (S). The support member 4300 may support an edge region of a substrate (S). For example, the support member 4300 may have a plate shape in which a hole 4310 is formed. The hole 4310 may have a shape equal to or similar to the shape of a substrate (S) and a size smaller than the substrate (S). The support member 4300 may be a slot type support member connected to support only an edge region of a substrate (S). Thus, most of the topside and rear side of a substrate (S) placed on the support member 4300 can be exposed. Thus, during a supercritical drying process in the second process chamber 4000, the entirety of the substrate (S) may be exposed to a supercritical fluid.

The support member 4300 may be disposed in the housing 4100. The support member 4300 extends upward from a lower wall of the housing 4100 in a direction perpendicular to the lower wall, and the upper end of the support member 4300 may be horizontally bent. Alternatively, the support member 4300 may be a slot type support member extending from both sidewalls of the housing 4100.

The heating member 4400 is used to heat the inside of the housing 4100. The heating member 4400 may heat a supercritical fluid supplied into the second process chamber 4000 to a critical temperature or higher so as to maintain the supercritical fluid at a supercritical state or return the supercritical fluid into the supercritical state if the supercritical fluid liquefies. The cylinders 4210 may be buried in a wall of the housing 4100. For example, a heater configured to generate heat from electricity received from an external power source may be used as the heating member 4400.

The supply ports 4500 supply a supercritical fluid to the second process chamber 4000. The supply ports 4500 may be connected to a supply line 4550 to supply a supercritical fluid. A valve may be disposed at the supply ports 4500 to control the flow rate of a supercritical fluid supplied from the supply line 4550.

The supply ports 4500 may be include an upper supply port 4510 and a lower supply port 4520. The upper supply port 4510 is disposed in an upper wall of the housing 4100 to supply a supercritical fluid to the top side of a substrate (S) supported on the support member 4300. The lower supply port 4520 is disposed in a lower wall of the housing 4100 to supply a supercritical fluid to the rear side of the substrate (S) placed on the support member 4300. The top side of the substrate (S) may be a patterned side, and the rear side of the substrate (S) may be a non-patterned side.

The supply ports 4500 (the upper supply port 4510 and the lower supply port 4520) may supply a supercritical fluid to center regions of the substrate (S). For example, the upper supply port 4510 may be located above the substrate (S) supported on the support member 4300 and aligned with the center of the substrate (S). For example, the lower supply port 4520 may be located under the substrate (S) supported on the support member 4300 and aligned with the center of the substrate (S). Then, a supercritical fluid supplied through the supply ports 4500 can be uniformly distributed to the entirety of the substrate (S) while the supercritical fluid reaches the center regions of the substrate (S) and spreads to the edge regions of the substrate (S).

A supercritical fluid may be supplied through the lower supply port 4520 and then the upper supply port 4510. In an early stage of a supercritical drying process, the inside pressure of the second process chamber 4000 may be lower than a critical pressure, and thus a supercritical fluid supplied into the second process chamber 4000 may be liquefied. Therefore, if a supercritical fluid is supplied through the upper supply port 4510 in an early stage of a supercritical drying process, the supercritical fluid may liquefy and fall to the substrate (S) by gravity to damage the substrate (S). A supercritical fluid may be supplied through the upper supply port 4510 after the supercritical fluid is supplied into the second process chamber 4000 through the lower supply port 4520 and the inside pressure of the second process chamber 4000 reaches a critical pressure, so as to prevent the supercritical fluid from liquefying and falling to the substrate (S).

The exhaust port 4700 discharges a supercritical fluid from the second process chamber 4000. The exhaust port 4600 may be connected to an exhaust line 4650 to discharge a supercritical fluid. A valve may be disposed at the exhaust port 4600 to control the flow rate of a supercritical fluid to be discharged through the exhaust line 4650. A supercritical fluid may be discharged to the atmosphere or a supercritical fluid recycling system (not shown).

The exhaust port 4600 may be formed in a lower wall of the housing 4100. In a late stage of a supercritical drying process, the inside pressure of the second process chamber 4000 may be reduced to a value lower than a critical pressure as a supercritical fluid is discharged from the second process chamber 4000, and thus a supercritical fluid filled in the second process chamber 4000 may be liquefied. The liquefied supercritical fluid may flow to the exhaust port 4600 formed in the lower wall of the housing 4100 by gravity and then flow to the outside through the exhaust port 4600.

Hereinafter, the second process chamber 4000 will be described according to another embodiment of the present invention.

Figure 10:
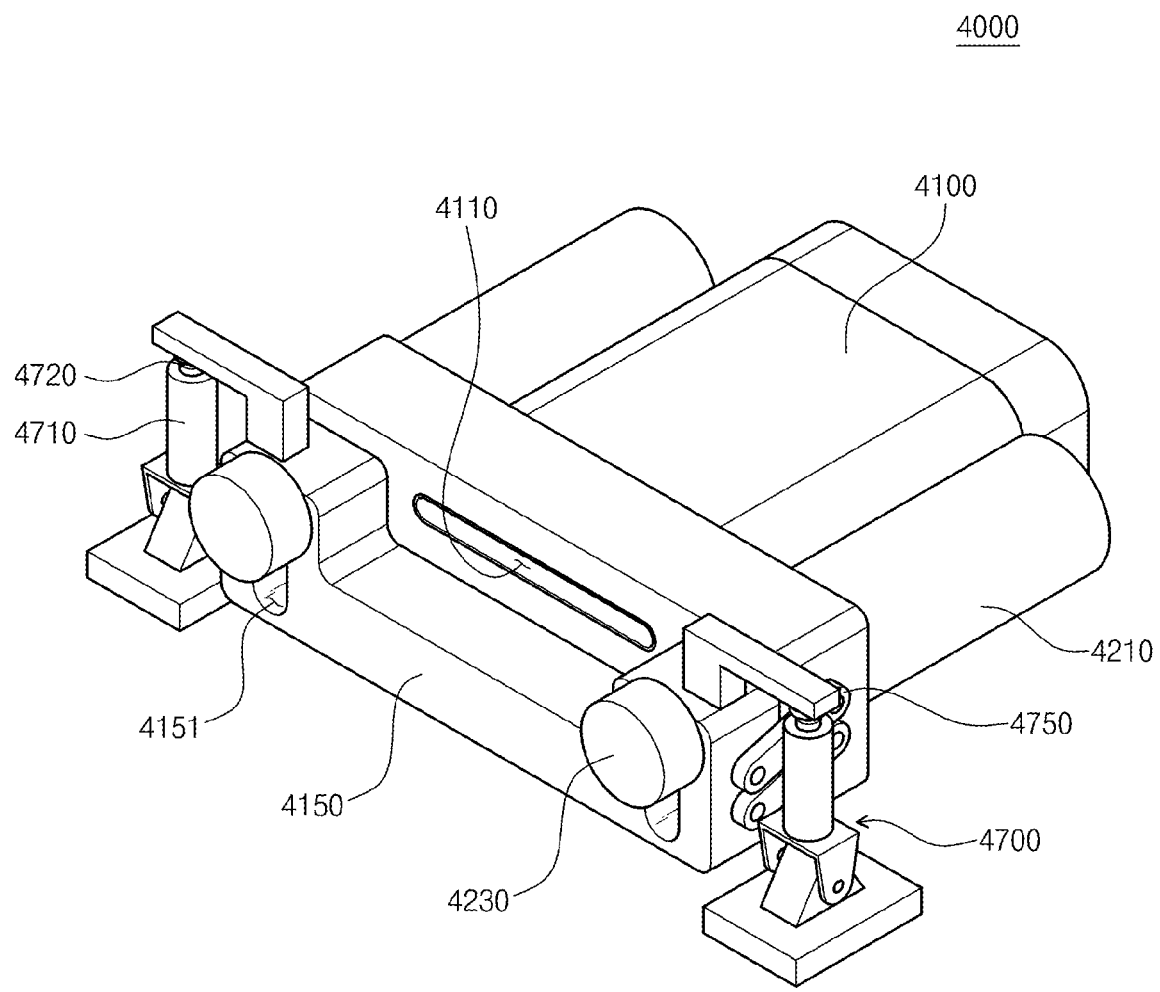
FIGS. 10 and 11 are perspective views illustrating the second process chamber according to another embodiment of the present invention.
Figure 11:
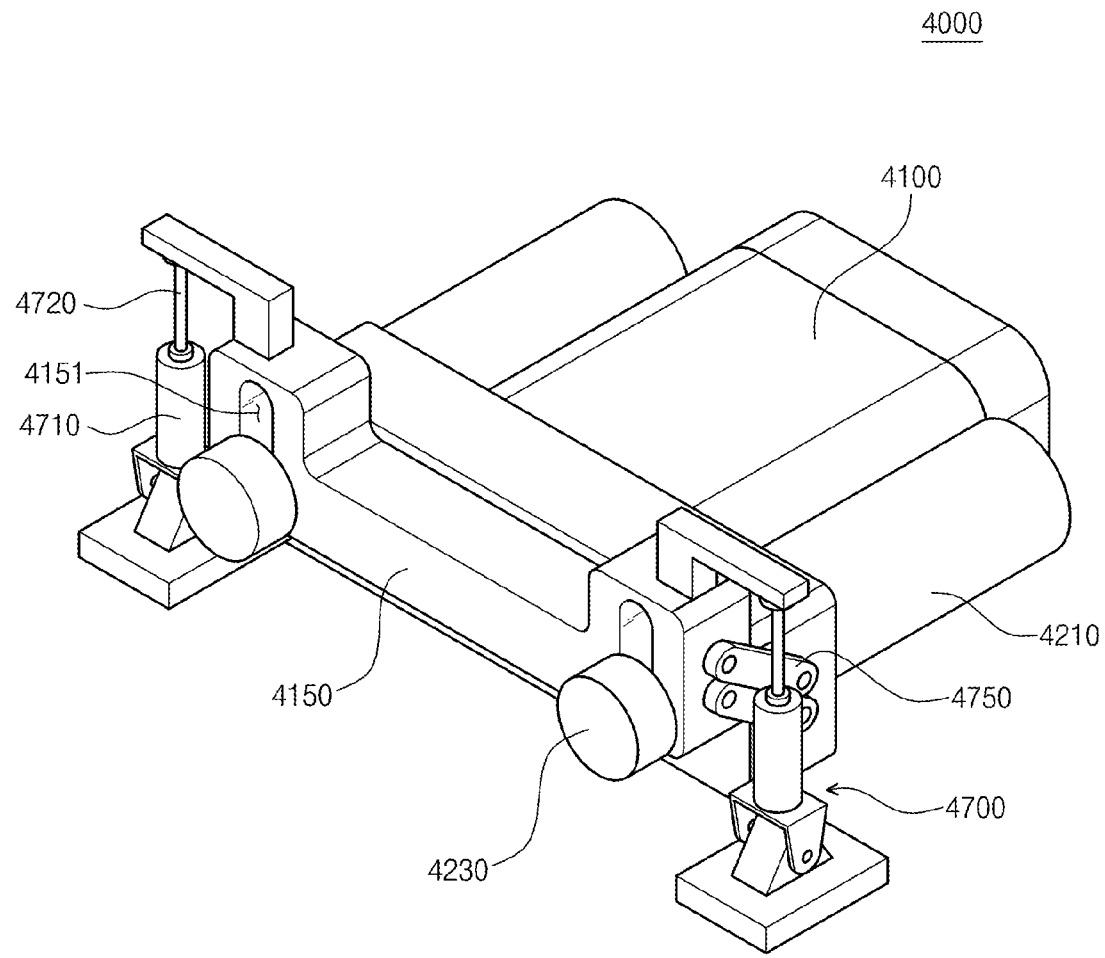

FIGS. 10 and 11 are perspective views illustrating the second process chamber 4000 according to another embodiment of the present invention.

The current embodiment is different from the previous embodiment in that the door 4150 is driven in a different way, and thus the difference will now be mainly described.

Referring to FIGS. 10 and 11, the surface of the housing 4100 in which the entrance 4110 and the entrance-closing surface of the door 4150 may be flat.

A plurality of door links 4750 may be provided at both sides of the housing 4100 and the door 4150. For example, two door links 4750 may be provided at both sides of the housing 4100 and the door 4150.

The door links 4750 may guide movement of the door 4150 in such a manner that the mutually-facing surfaces of the door 4150 and the housing 4100 can be maintained parallel.

Door actuators 4700 may include: door cylinders 4710 configured to generate driving forces; and door rods 4720 having ends coupled to the door 4150. The door rods 4720 may receive driving forces from the door cylinders 4710 and apply the driving forces to the door 4150 in a vertical direction.

The door actuators 4700 apply forces to the door 4150 in a vertical direction, and then the door 4150 is lifted or lowered while being guided by the door links 4750 in such a manner that the door-closing surface of the door 4150 is kept parallel with the surface of the housing 4100 in which the entrance 4110 is formed. In this way, the door 4150 is lifted or lowered to close or open the entrance 4110.

A center region of the surface of the door 4150 facing the housing 4100 may be brought into contact with the entrance 4110, and side regions of the surface of the door 4150 facing the housing 4100 may be coupled to the door rods 4720. In this case, the center region of the door 4150 may be thinner than the side regions of the door 4150. In this case, although the door 4150 is vertically moved within a relatively small range, the entrance 4110 may be effectively closed or opened. Grooves 4151 may be formed from a bottom side to a middle region of the door 4150 or may be formed in the middle region of the door 4150.

A plurality of such second process chambers 4000 may be provided in the substrate treating apparatus 100. In this case, the plurality of second process chambers 4000 may be arranged in a stacked manner.

Figure 12:
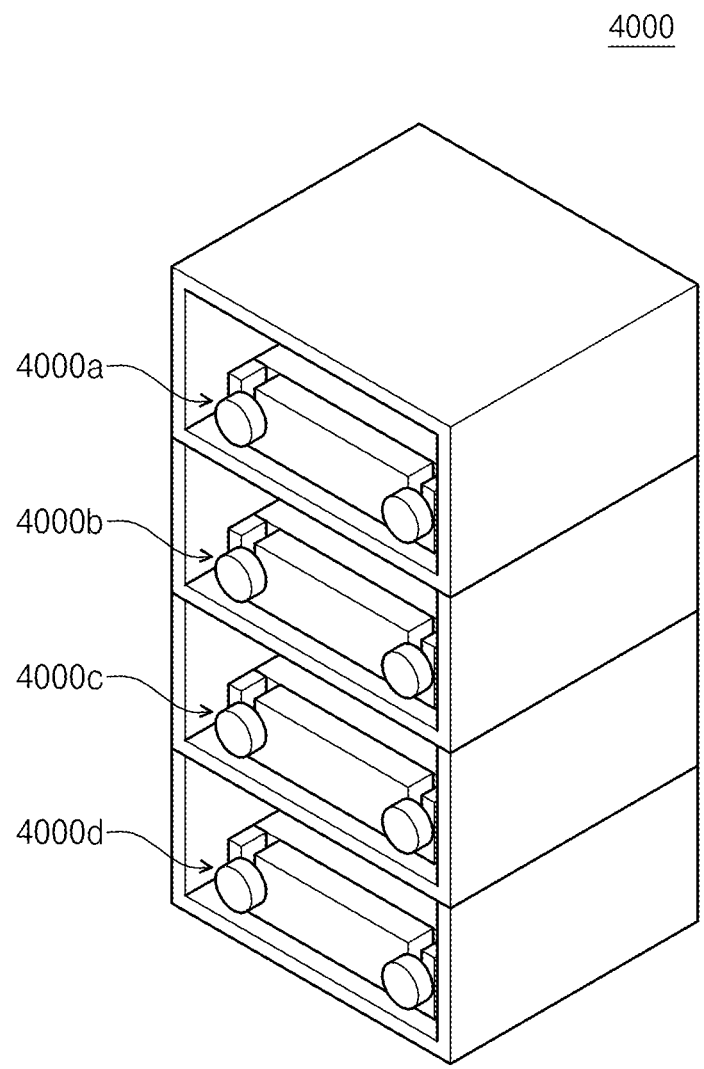
FIG. 12 is a view in which such second process chambers as depicted in FIG. 2 are stacked.

FIG. 12 illustrates a stacked state of second process chambers 4000 such as the second process chamber 4000 shown in FIG. 2.

Referring to FIG. 12, four second process chambers 4000a, 4000b, 4000c, and 4000d are vertically stacked. The number of the second process chambers 4000 may be varied if necessary. In the second process chambers 4000, after doors 4150 open entrances 4110, substrates (S) are slid into lateral sides of housings 4100 through the entrances 4110. Therefore, the heights of the second process chambers 4000 can be small. In addition, since the sizes of the entrances 4110 are small owing to this structure, the entrances 4110 can be kept in a closed state with less forces during a supercritical drying process. That is, small pressing members 4200 having low power can be used to close the housings 4100. As a result, the sizes of the second process chambers 4000 for performing a supercritical drying process can be reduced. Particularly, the heights of the second process chambers 4000 can be reduced. Therefore, the second process chambers 4000 can be easily stacked.

While the present invention has been explained for the case where substrate treating apparatus 100 treats a substrate (S) using a supercritical fluid, the substrate treating apparatus 100 of the present invention is not limited to performing a supercritical drying process. For example, the substrate treating apparatus 100 may be used to treat a substrate (S) by supplying a different process fluid into the second process chamber 4000 through the supply ports 4500 instead of supplying a supercritical fluid. For example, organic solvents, gases having various ingredients, plasma gases, or inert gases may be used instead of a supercritical fluid.

In addition, the substrate treating apparatus 100 may further include a controller for controlling elements of the substrate treating apparatus 100. For example, the controller may control the heating member 4400 to adjust the inside temperature of the housing 4100. In another example, the controller may control valves disposed at the nozzle member 3200, the supply line 4550, and the exhaust line 4750 to adjust the flow rates of a chemical or supercritical fluid. In another example, the controller may control the door actuator 4700 or the pressing members 4200 to open or close the housing 4100. In another example, under the control of the controller, a supercritical fluid may be supplied through one of the upper supply port 4510 and the lower supply port 4520, and if the inside pressure of the second process chamber 4000 reaches a preset value, the supercritical fluid may be supplied through the other of the upper supply port 4510 and the lower supply port 4520.

The controller may be hardware, software, or a device such as computer provided as a combination of hardware and software.

For example, the controller may be hardware such as ASICs (application specific integrated circuits), DSPs (digital signal processors), DSPDs (digital signal processing devices), PLDs (programmable logic devices), FPGAs (field programmable gate arrays), processors, micro-controllers, microprocessors, and electric devices having similar control functions.

For example, the controller may be software such as a software code or application written in at least one programming language. Software may be executed by a controller provided in the form of hardware. Alternatively, software may be transmitted from an external device such as a server to a controller provided in the formed of hardware and may be installed on the controller.

Hereinafter, a substrate treating method will be explained using the substrate treating apparatus 100 according to an embodiment of the present invention. Although the substrate treating method is explained using the substrate treating apparatus 100 in the following description, the substrate treating method may be performed using another apparatus similar to the substrate treating apparatus 100. In addition, the substrate treating method of the present invention may be stored in a computer-readable recording medium in the form of an executable code or program.

Hereinafter, an embodiment of the substrate treating method of the present invention will be explained. The embodiment relates to a cleaning process in general.

Figure 13:
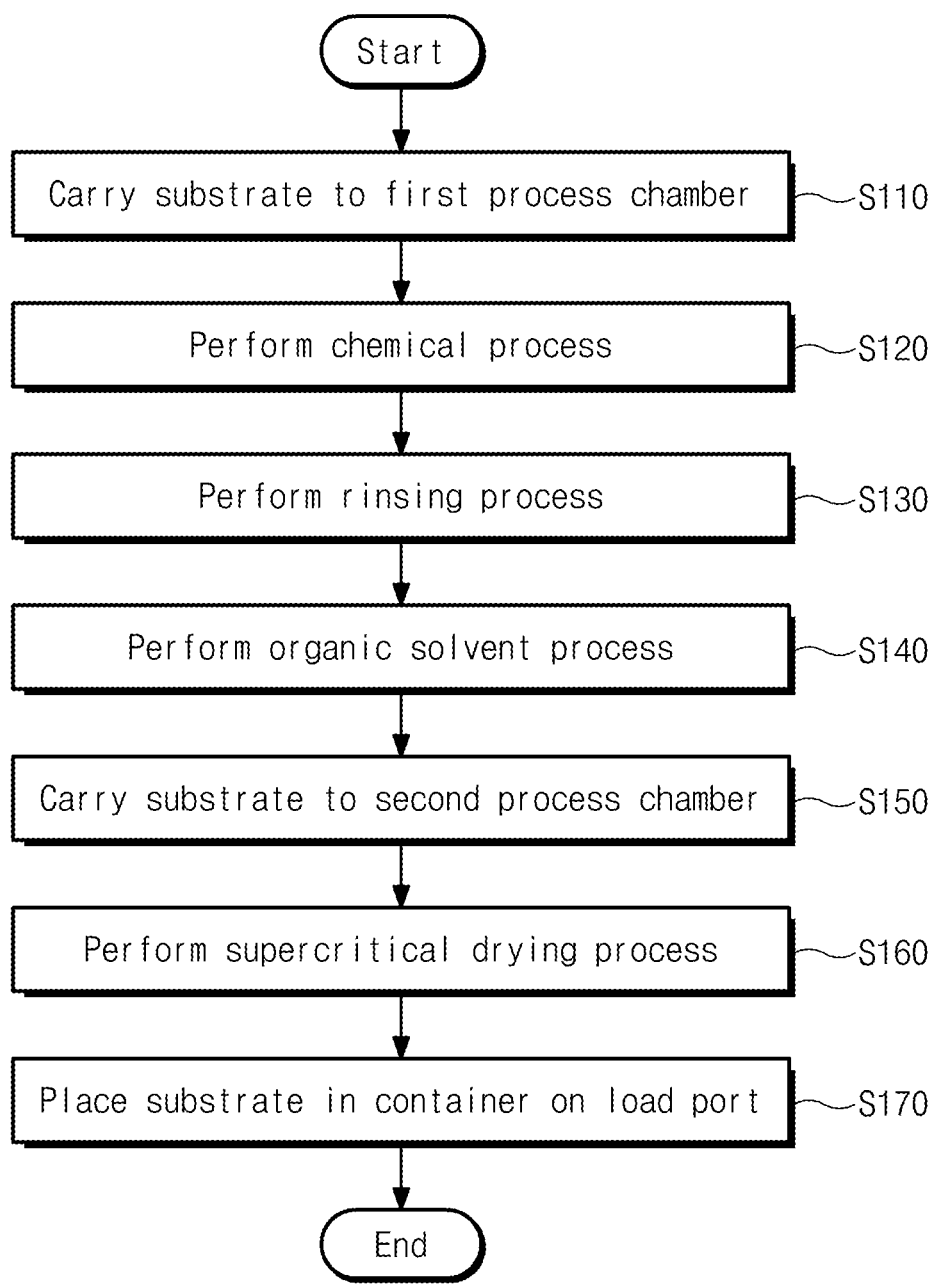
FIG. 13 is a flowchart for explaining a substrate treating method according to an embodiment of the present invention.

FIG. 13 is a flowchart for explaining a substrate treating method according to an embodiment of the present invention; and The substrate treating method of the current embodiment includes: operation S110 in which a substrate (S) is carried into the first process chamber 3000; operation S120 in which a chemical process is performed; operation S130 in which a rinsing process is performed; operation S140 in which an organic solvent process is performed; operation S150 in which the substrate (S) is carried to a second process chamber 4000; operation S160 in which a supercritical drying process is performed; and operation S170 in which the substrate (S) is put in a container (C) placed in a load port 1100. The above-listed operations are not required to be performed in the listed order. For example, an operation listed later may be performed prior to an operation listed first. This is equal in another embodiment of the substrate treating method. The operations will now be explained in detail.

A substrate (S) is carried into the first process chamber 3000 (S110). First, a container in which substrates (S) are stored is placed on the load port 1100 by a carrying device such as an OHT. Then, the index robot 1210 picks up a substrate (S) from the container and places the substrate (S) in a buffer slot. The transfer robot 2210 picks up the substrate (S) from the buffer slot and carries the substrate (S) into the first process chamber 3000. The substrate (S) is placed on the support plate 3110 in the first process chamber 3000.

Thereafter, a chemical process is performed (S120). After the substrate (S) is placed on the support plate 3110, the nozzle shaft 3230 is moved and rotated by the nozzle shaft actuator 3240 to place the nozzle 3210 directly above the substrate (S). A detergent is injected to the top side of the substrate (S) through the nozzle 3210. Contaminants are removed from the substrate (S) as the detergent is injected. At this time, the rotary actuator 3130 rotates the rotation shaft 3120 to rotate the substrate (S). As the substrate (S) is rotated, the detergent can be uniformly supplied to the substrate (S) although the detergent scatters from the substrate (S). The detergent scattering from the substrate (S) is collected in the collecting vessels 3310 where the detergent is discharged to a fluid recycling system (not shown) through the collecting line 3320. At this time, the lift actuator 3340 lifts or lowers the collecting vessels 3310 so that the scattering detergent can be collected in one of the collecting vessels 3310.

If contaminants are sufficiently removed from the substrate (S), a rinsing process is performed (S130). After the chemical process performed to remove contaminants from the substrate (S), the detergent remains on the substrate (S). The nozzle 3210 through which the detergent is injected is moved away from the topside of the substrate (S), and another nozzle 3210 is moved to a position directly above the substrate (S) to inject a rinsing agent to the topside of the substrate (S). The rinsing agent supplied to the substrate (S) cleans the detergent remaining on the substrate (S). During the rinsing process, the substrate (S) may be rotated, and a chemical may be collected. The lift actuator 3340 adjusts the height of the collecting vessels 3310 so that the rinsing agent can be collected in one of the collecting vessels 3310 different from that used to collect the detergent.

After the substrate (S) is sufficiently washed, an organic solvent process is performed (S140). After the rinsing process, another nozzle 3210 is moved to a position directly above the substrate (S) to inject an organic solvent to the substrate (S). The rinsing agent remaining on the substrate (S) is replaced with the organic solvent. In the organic solvent process, the substrate (S) may not be rotated or may be rotated at low speed. The reason for this is that if the organic solvent evaporates soon, the surface tension of the organic solvent may cause interfacial tension between circuit patterns of the substrate (S) to make the circuit patterns collapse.

After the organic solvent process in the first process chamber 3000, the substrate (S) is carried to the inside of the second process chamber 4000 (S150), and a supercritical drying process is performed in the second process chamber 4000 (S160). The operations S150 and S160 will be explained later in more detail when another embodiment of the substrate treating method is explained.

After the supercritical drying process, the substrate (S) is carried into the container placed on the load port 1100 (S170). The second process chamber 4000 is opened, and the transfer robot 2210 picks up the substrate (S). The substrate (S) may be carried to the buffer chamber 2100 by the transfer robot 2210, and the index robot 1210 may carry the substrate (S) from the buffer chamber 2100 to the container (C).

Hereinafter, another embodiment of the substrate treating method of the present invention will be explained. The other embodiment of the substrate treating method relates to a supercritical drying process in the second process chamber 4000.

Figure 14:
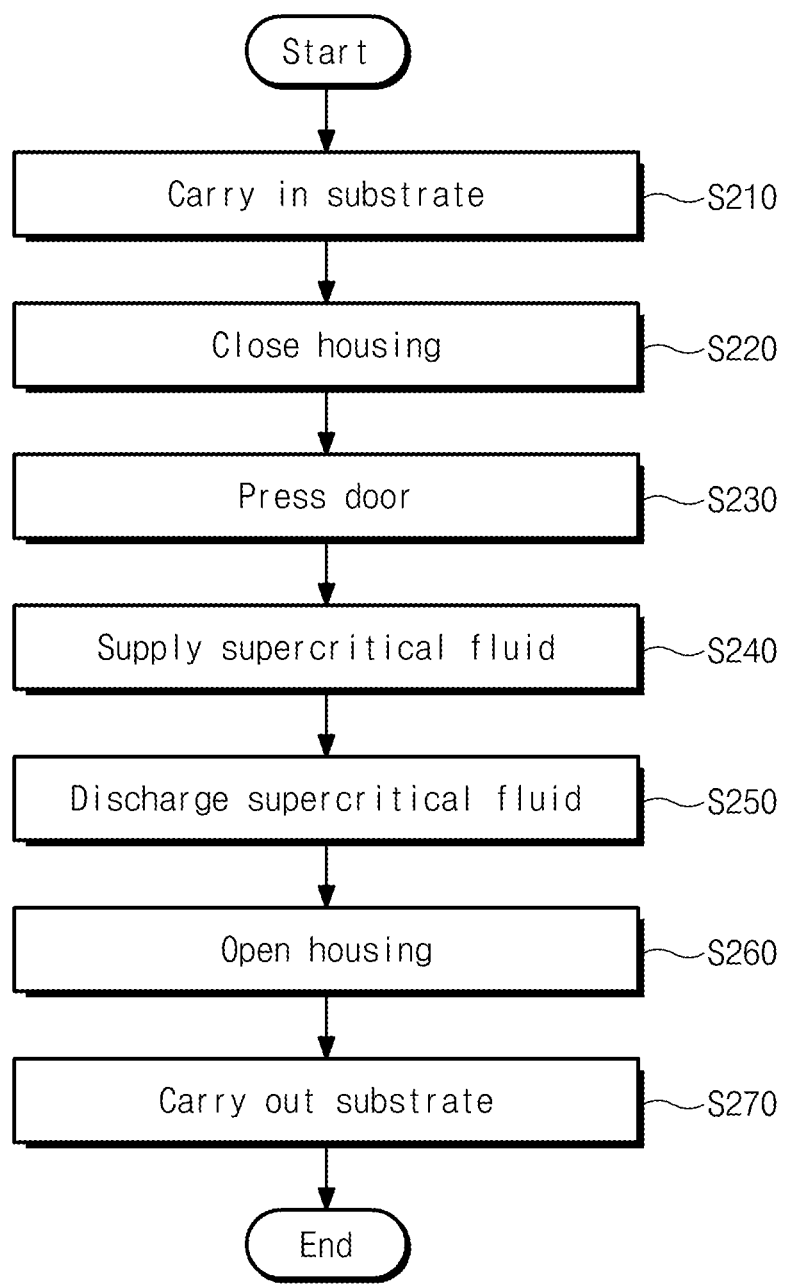
FIG. 14 is a flowchart for explaining another embodiment of the substrate treating method.

FIG. 14 is a flowchart for explaining another embodiment of the substrate treating method.

Referring to FIG. 14, the substrate treating method of the other embodiment includes: operation S210 in which a substrate (S) is carried into the housing 4100; operation S220 in which the housing 4100 is closed; operation S230 in which the door 4150 is pressed; operation S240 in which a supercritical fluid is supplied; operation S250 in which the supercritical fluid is discharged; operation S260 in which the housing 4100 is opened; and operation S270 in which the substrate (S) is carried out of the housing 4100. The operations will now be explained in detail.

A substrate (S) is carried into the second process chamber 4000 (S210). At this time, in the second process chamber 4000, the housing 4100 and the door 4150 are spaced apart from each other. That is, the door 4150 is opened. Therefore, the transfer robot 2210 can put the substrate (S) in the housing 4100 in such a manner that the substrate (S) slides into the housing 4100 through the entrance 4110 formed in a lateral side of the housing 4100. The transfer robot 2210 may pick up the substrate (S) from the first process chamber 3000 in a state where an organic solvent remains on the substrate (S), and may place the substrate (S) on the support member 4300 disposed in the housing 4100.

After the substrate (S) is carried in the housing 4100, the housing 4100 is closed (S220). The door actuator 4700 applies a driving force to the door 4150, and then the door 4150 is moved while being guided by the door link 4750. The door 4150 may be rotated about the end of the door link 4750 coupled to the housing 4100 or may be vertically moved while being kept parallel with the surface of the housing 4100 in which the entrance 4110 is formed, so as to close the entrance 4110. As the door 4150 makes tight contact with the entrance 4110, the inside of the housing 4100 is sealed. In addition, after the door actuator 4700 moves the door 4150 close to the entrance 4110, the pressing members 4200 may apply forces the door 4150 in a direction toward the housing 4100 so as to bring the door 4150 into contact with the housing 4100.

If the door 4150 makes contact with or moves close to the surface of the housing 4100 in which the entrance 4110 is formed, the door 4150 is pressed (S230). In detail, if the door 4150 is brought into contact with or moved close to the surface of the housing 4100 in which that entrance 4110 is formed, the pressing rods 4220 are inserted in the grooves 4151 of the door 4150, and the pressing plates 4230 are placed on the surface of the door 4150 opposite to the housing 4100. The pressing cylinders 4210 apply forces to the pressing rods 4220 in a direction from the door 4150 to the housing 4100, and then the door 4150 receives the forces through the pressing plates 4230 coupled to ends of the pressing rods 4220 and making contact with the surface of the door 4150 opposite to the housing 4100. Since the pressing plates 4230 push the door 4150, the door 4150 can close the housing 4100 securely.

After the housing 4100 is closed, a supercritical fluid is supplied (S240). The supercritical fluid may be injected into the housing 4100 through the supply ports 4500. At this time, the support member 4300 heats the inside of the housing 4100 to keep the inside of the housing 4100 at a supercritical state. The injected supercritical fluid may be supplied to the substrate (S) so as to dissolve an organic solvent remaining on the substrate (S) and thus dry the substrate (S).

The supercritical fluid may be supplied through the upper supply port 4510 and the lower supply port 4520. At this time, the support member 4300 may be placed closer to the upper wall of the housing 4100 than the lower wall of the housing 4100. In the case where the topside of the substrate (S) is a patterned side and the rear side of the substrate (S) is a non-patterned side, if the support member 4300 is closer to the upper wall of the housing 4100, the supercritical fluid supplied through the upper supply port 4510 may be effectively supplied to the substrate (S). Then, the patterned side of the substrate (S) may be effectively dried. That is, an organic solvent remaining between circuit patterns of the substrate (S) may be effectively dried.

Therefore, the supercritical fluid may first be supplied through the lower supply port 4520 and then through the upper supply port 4510. When the supercritical fluid is initially supplied, the inside pressure of the housing 4100 may be lower than a critical pressure, and thus the supercritical fluid may liquefy. If the supercritical fluid is supplied to a position above the topside of the substrate (S), the supercritical fluid may liquefy and fall to the topside of the substrate (S) by gravity to damage the substrate (S). Therefore, the supercritical fluid may first be supplied through the lower supply port 4520 and then through the upper supply port 4510.

If the supercritical fluid is continuously supplied through the lower supply port 4520, the inside pressure of the housing 4100 may become equal to or greater than a critical pressure, and if the inside of the housing 4100 is heated by the heating member 4400, the inside temperature of the housing 4100 may become equal to or greater than a critical temperature. Thus, the inside of the housing 4100 can be in a supercritical state. When the inside of the housing 4100 enters a supercritical state, the supercritical fluid may be supplied through the upper supply port 4510. That is, under the control of the controller, the supercritical fluid may be supplied through the upper supply port 4510 when the inside pressure of the housing 4100 becomes equal to or greater than a critical pressure.

As described above, while a supercritical drying process is performed by supply a supercritical fluid, the inside of the housing 4100 is kept in a supercritical state at a high pressure greater than a critical pressure. Therefore, due to a pressure different between the inside and outside of the housing 4100, a force is applied to the surface of the door 4150 making contact with the entrance 4110 to move the door 4150 away from the housing 4100. However, the housing 4100 can be kept in a closed state because the pressing members 4200 apply a force greater than the force caused by the pressure difference to the surface of the door 4150 opposite to the entrance 4110.

If the substrate (S) is sufficiently dried as the organic solvent remaining on the substrate (S) is dissolved in the supercritical fluid, the supercritical fluid is discharged (S250). The supercritical fluid is discharged from the second process chamber 4000 through the exhaust ports 4600. Supply and discharge of the supercritical fluid may be controlled by adjusting the flow rates of the supercritical fluid in the supply line 4550 and the exhaust line 4650 by using the controller. The supercritical fluid may be discharged to the atmosphere or a supercritical fluid recycling system (not shown) through the exhaust line 4650.

If the inside pressure of the second process chamber 4000 is sufficiently reduced to, for example, atmospheric pressure after the supercritical fluid is discharged, the housing 4100 is opened (S260). The pressing members 4200 do not apply forces to the door 4150, and the door actuator 4700 moves the door 4150 away from the entrance 4110.

After the door 4150 is moved away and the housing 4100 is opened, the substrate (S) is carried out from the housing 4100 (S270). The transfer robot 2210 may pick up the substrate (S) from the support member 4300 placed in the housing 4100 and carry the substrate (S) out of the second process chamber 4000.

According to the present invention, the door is slidable in the process chamber, and thus the process chamber occupies less space in a vertical direction.

In addition, according to the present invention, the process chambers can be vertically stacked. That is, more process chambers can be disposed in the same foot print, and thus substrate processing efficiency can be improved.

In addition, according to the present invention, since the press members can press the door, the door can be stably closed during a process.

The present invention is not limited thereto. Other features and spirit of the present invention will be apparently understood by those skilled in the art through the following description and accompanying drawings.

The above-described embodiments are given so that those of skill in the related art could easily understand the present invention, and are not intended to limit the present invention.

Thus, the embodiments and elements thereof can be used in other ways or with known technology, and various modifications and changes in form and details can be made without departing from the scope of the present invention.

In addition, the scope of the present invention is defined by the following claims, and all differences within the scope will be considered as being included in the present invention.

What is claimed is:

1. An apparatus for treating a substrate, the apparatus comprising:
   a housing comprising an entrance in a predetermined surface thereof and providing a space for performing a high pressure process;
   a support member disposed in the housing to support a substrate;
   a door for opening and closing the entrance;

a pressing member configured to apply a force to the door so as to close the housing during the high pressure process;

the pressing member includes,
- a pressing plate configured to press the door at an opposite surface to the entrance-closing surface of the door,
- a cylinder configured to generate a driving force,
- a rod having an end to which the pressing plate is coupled, the rod being configured to transmit the driving force of the cylinder to the pressing plate, and
- a groove is formed in a top surface or a bottom surface of the door, and if the door is lifted, the rod is inserted in the groove and the pressing plate is placed on the opposite surface of the door.

2. The apparatus of claim 1, further comprising:
a door actuator configured to move the door; and
a link having an end coupled to the housing and the other end coupled to the door for guiding movement of the door.

3. The apparatus of claim 2, wherein the end of the link is coupled to a side surface of the housing perpendicular to the predetermined surface of the housing in which the entrance is formed, and the other end of the link is coupled to a side surface of the door perpendicular to the entrance-closing surface of the door used to close the entrance.

4. The apparatus of claim 3, wherein the link guides the door in such a manner that the door is rotated on the end of the link.

5. The apparatus of claim 4, further comprising another link, wherein the links are coupled to both sides of the housing and the door, respectively.

6. The apparatus of claim 4, wherein the predetermined surface of the housing and the entrance-closing surface of the door are formed in corresponding curved shapes.

7. The apparatus of claim 3, wherein the link guides the door in such a manner that the door is moved upward or downward while a surface of the door making contact with the predetermined surface of the housing is kept in parallel with the predetermined surface of the housing.

8. The apparatus of claim 7, further comprising another link, wherein the links are coupled to both sides of the housing and the door, respectively.

9. The apparatus of claim 1, further comprising:
a heating member configured to heat an inside of the housing;
a supply port configured to supply a supercritical fluid to the housing; and
an exhaust port configured to discharge the supercritical fluid from the housing.

10. The apparatus of claim 9, wherein the supply port comprises:
an upper supply port disposed at an upper surface of the housing; and
a lower supply port disposed at a lower surface of the housing.

11. An apparatus for treating a substrate, the apparatus comprising:
a transfer chamber configured to transfer a substrate;
a process chamber comprising a housing that has an entrance in a predetermined surface thereof and provides a space for performing a high pressure process, a support member disposed in the housing to support the substrate, a door for opening and closing the entrance, and a pressing member configured to apply a force to the door to close the housing during the high pressure process,
wherein a side surface of the transfer chamber faces the predetermined surface of the housing;
the process chamber further includes,
a door actuator configured to move the door, and
a link having an end coupled to the housing and the other end coupled to the door for guiding movement of the door; and
the link guides the door in such a manner that the door is moved upward or downward while a surface of the door making contact with the predetermined surface of the housing is kept in parallel with the predetermined surface of the housing.

12. The apparatus of claim 11, wherein the link guides the door in such a manner that the door is rotated on the end of the link.

13. The apparatus of claim 12, wherein the end of the link is coupled to a side surface of the housing perpendicular to the predetermined surface of the housing in which the entrance is formed, and the other end of the link is coupled to a side surface of the door perpendicular to an entrance-closing surface of the door used to close the entrance,
wherein the process chamber further comprises another link, and the links are provided at both sides of the housing and the door, respectively,
wherein the predetermined surface of the housing and the entrance-closing surface of the door are formed in corresponding curved shapes.

14. The apparatus of claim 11, wherein the end of the link is coupled to a side surface of the housing perpendicular to the predetermined surface of the housing in which the entrance is formed, and the other end of the link is coupled to a side surface of the door perpendicular to an entrance-closing surface of the door used to close the entrance,
wherein the process chamber further comprises another link, and the links are provided at both sides of the housing and the door, respectively.

15. The apparatus of claim 11, wherein the pressing member comprises:
a pressing plate configured to press the door at a surface opposite to the entrance-closing surface of the door;
a cylinder configured to generate a driving force; and
a rod having an end to which the pressing plate is coupled, the rod being configured to transmit the driving force of the cylinder to the pressing plate.

16. The apparatus of claim 15, wherein a groove is formed in a top surface or a bottom surface of the door, and if the door is lifted, the rod is inserted in the groove and the pressing plate is placed on the opposite surface of the door.

17. The apparatus of claim 11, further comprising one or more process chambers, wherein the process chambers are vertically stacked.

18. A method for treating a substrate, the method comprising:
carrying a substrate into a housing through an entrance;
closing the entrance with a door;
pressing the door at a surface opposite to an entrance-closing surface of the door so as to close the housing;
performing a predetermined process on the substrate disposed in the closed housing; and
the closing of the entrance is performed by vertically moving the door relative to the entrance.

* * * * *